United States Patent
Oh et al.

(10) Patent No.: US 8,669,548 B2
(45) Date of Patent: Mar. 11, 2014

(54) ORGANIC LIGHT-EMITTING DISPLAY APPARATUS AND METHOD OF MANUFACTURING THE SAME

(75) Inventors: Jae-Hwan Oh, Yongin (KR); Young-Jin Chang, Yongin (KR); Seong-Hyun Jin, Yongin (KR); Se-Hun Park, Yongin (KR); June-Woo Lee, Yongin (KR); Kwang-Hae Kim, Yongin (KR); Jong-Hyun Choi, Yongin (KR); Kwan-Wook Jung, Yongin (KR); Won-Kyu Lee, Yongin (KR); Jae-Beom Choi, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/426,733

(22) Filed: Mar. 22, 2012

(65) Prior Publication Data
US 2013/0056710 A1    Mar. 7, 2013

(30) Foreign Application Priority Data

Sep. 6, 2011   (KR) .................. 10-2011-0090206

(51) Int. Cl.
    *H01L 29/08* (2006.01)
    *H01L 35/24* (2006.01)
    *H01L 51/00* (2006.01)
(52) U.S. Cl.
    USPC .................. 257/40; 257/59; 257/72; 438/99; 438/149
(58) Field of Classification Search
    USPC .......... 257/E27.119, E51.018, 40, 52, 53, 57, 257/59, 72, 288, 291, 292, 301, 303, 306, 257/79, 80, 83, 84, 86, 103, 431, 443; 438/82, 99, 482, 48, 149, 128, 151, 438/283, 197, 243, 386, 244, 253, 387, 396, 438/22, 24, 54, 69, 26, 46
    See application file for complete search history.

(56) References Cited

U.S. PATENT DOCUMENTS

| 2009/0278131 | A1 | 11/2009 | Kwon et al. |
| 2012/0074413 | A1 | 3/2012 | Kim |
| 2013/0015459 | A1* | 1/2013 | Lee et al. ............ 257/72 |
| 2013/0037818 | A1* | 2/2013 | Lee et al. ............ 257/72 |

FOREIGN PATENT DOCUMENTS

| KR | 10-2003-0047431 A | 6/2003 |
| KR | 10-2003-0058228 A | 7/2003 |
| KR | 10-0483402 B1 | 4/2005 |
| KR | 10-2009-0116131 | 11/2009 |
| KR | 10-2012-0032906 | 4/2012 |

* cited by examiner

Primary Examiner — Thanh Y Tran
(74) Attorney, Agent, or Firm — Lee & Morse, P.C.

(57) ABSTRACT

An organic light-emitting display apparatus includes a first insulating layer, a second insulating layer on the first insulating layer and including an unevenness portion, a third insulating layer on the second insulating layer, a pixel electrode on the third insulating layer, an opposite electrode facing the pixel electrode, and an organic emission layer between the pixel electrode and the opposite electrode; a thin film transistor including an active layer, a gate electrode, and source/drain electrodes connected to the active layer, the first insulating layer being between the active layer and the gate electrode and the second insulating layer being between the gate electrode, and the source/drain electrodes; and a capacitor including a lower electrode on a same layer as the gate electrode, a dielectric layer of a same material as the third insulating layer, and an upper electrode on a same layer as the pixel electrode.

22 Claims, 6 Drawing Sheets

ORGANIC LIGHT-EMITTING DISPLAY APPARATUS AND METHOD OF MANUFACTURING THE SAME

CROSS-REFERENCE TO RELATED PATENT APPLICATION

This application claims the benefit of Korean Patent Application No. 10-2011-0090206, filed on Sep. 6, 2011, in the Korean Intellectual Property Office, the disclosures of which are incorporated herein in their entirety by reference.

BACKGROUND OF THE INVENTION

1. Field of the Invention

One or more embodiments relate to an organic light-emitting display apparatus and a method of manufacturing the same, and more particularly, to an organic light-emitting display apparatus with a simplified manufacturing process and which reduces color shift caused by a viewing angle and a method of manufacturing the same.

2. Description of the Related Art

Organic light-emitting display apparatuses have drawn attention as next generation display devices, because the weight and thickness of the organic light-emitting display apparatus can be reduced and the organic light-emitting display apparatuses have superior characteristics such as wide viewing angles, excellent contrast, and short response times.

SUMMARY OF THE INVENTION

According to an embodiment, there is provided an organic light-emitting display apparatus including an organic light-emitting device including a first insulating layer disposed on a substrate, a second insulating layer disposed on the first insulating layer and including an unevenness portion, a third insulating layer disposed on the second insulating layer, a pixel electrode disposed on the third insulating layer, an opposite electrode disposed to face the pixel electrode, and an organic emission layer disposed between the pixel electrode and the opposite electrode; a thin film transistor (TFT) including an active layer disposed on the substrate, a gate electrode disposed to be insulated from the active layer, and a source electrode and a drain electrode that are connected to the active layer, wherein the first insulating layer may be disposed between the active layer and the gate electrode and the second insulating layer may be disposed between the gate electrode and the source electrode and the drain electrode; and a capacitor including a lower electrode disposed on a same layer as the gate electrode, an upper electrode disposed on a same layer as the pixel electrode, and between the lower electrode and the upper electrode, a dielectric layer formed from the same material as the third insulating layer.

The first insulating layer, the second insulating layer, and the third insulating layer may be sequentially disposed between the substrate and the pixel electrode, and at least two of the first through third insulating layers may have different refractive indices.

The unevenness portion may include a plurality of concavities and a plurality of protrusions between the concavities, and the second insulating layer may be fully etched in a region corresponding to the plurality of concavities.

The first insulating layer may be etched along an etching surface of the second insulating layer in the region corresponding to the concavities, such that the concavities are extended.

The organic light-emitting display apparatus may further include a buffer layer disposed between the substrate and the first insulating layer.

A refractive index of the buffer layer may be different from a refractive index of the first insulating layer.

The first insulating layer and the buffer layer may be etched along the etching surface of the second insulating layer in the region corresponding to the concavities, such that the concavities are extended.

A height of the protrusions that are disposed between the extended concavities may be equal to or greater than 0.5 μm.

A thickness of the third insulating layer may be less than a thickness of the second insulating layer.

A dielectric constant of the third insulating layer may be larger than a dielectric constant of the first insulating layer.

The pixel electrode may include at least one transparent conductive material selected from indium tin oxide (ITO), indium zinc oxide (IZO), zinc oxide (ZnO), indium oxide ($In_2O_3$), indium gallium oxide (IGO), and aluminum zinc oxide (AZO).

The pixel electrode may further include a semi-transparent metallic layer.

The pixel electrode and the third insulating layer may have the same etching surface.

The upper electrode and the dielectric layer may have the same etching surface.

According to another aspect, there is provided a method of manufacturing an organic light-emitting display apparatus, the method including: performing a first mask process of forming a semiconductor layer on a substrate and patterning the semiconductor layer to form an active layer of a thin film transistor (TFT); performing a second mask process of forming a first insulating layer, stacking a first conductive layer on the first insulating layer and patterning the first conductive layer to form a gate electrode of the thin film transistor (TFT) and a lower electrode of a capacitor; performing a third mask process of forming a second insulating layer and patterning the second insulating layer to form an unevenness portion, a first opening through which the active layer is exposed, and a second opening through which the lower electrode is exposed; performing a fourth mask process of sequentially forming an insulating layer and a second conductive layer and simultaneously patterning the insulating layer and the second conductive layer to form a third insulating layer and a pixel electrode that are disposed on the second insulating layer and a dielectric layer and an upper electrode that are disposed on the lower electrode; performing a fourth mask process of forming a third conductive layer and patterning the third conductive layer to form a source electrode and a drain electrode; performing a sixth mask process of forming a fourth insulating layer and forming a third opening through which the pixel electrode is exposed; and forming an organic emission layer and an opposite electrode on the third opening.

At least two of the first insulating layer, the second insulating layer, and the third insulating layer may be formed of materials having different refractive indices.

The unevenness portion may include a plurality of concavities and a plurality of protrusions between the concavities, and the second insulating layer in a region corresponding to the plurality of concavities may be fully etched.

The first insulating layer may be etched along the etching surface of the second insulating layer in the region corresponding to the concavities, so that the concavities are extended.

The method may further include forming a buffer layer on the substrate before the performing of the first mask process.

A refractive index of the buffer layer may be different from a refractive index of the first insulating layer.

The first insulating layer and the buffer layer may be etched along the etching surface of the second insulating layer in the region corresponding to the concavities, so that the concavities are extended.

A height of the protrusions that are disposed between the plurality of extended concavities may be equal to or greater than 0.5 μm.

BRIEF DESCRIPTION OF THE DRAWINGS

The above and other features and advantages will become more apparent by describing in detail exemplary embodiments thereof with reference to the attached drawings in which.

DETAILED DESCRIPTION OF THE INVENTION

Embodiments will now be described more fully with reference to the accompanying drawings in which exemplary embodiments of the invention are shown.

Figure 1:
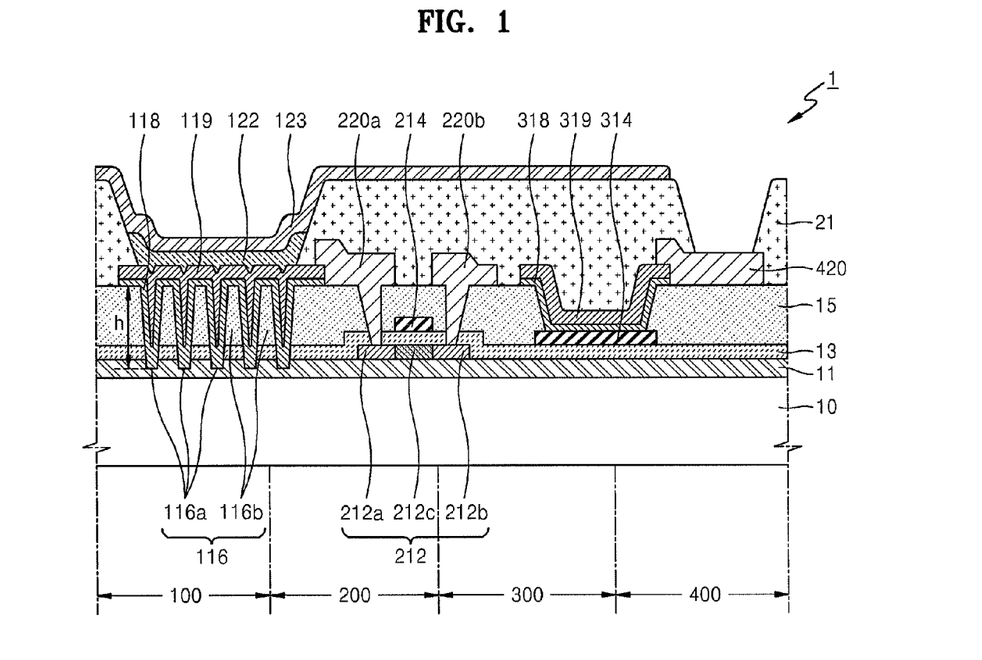
FIG. 1 is a schematic cross-sectional view of an organic light-emitting display apparatus according to an embodiment.

FIG. 1 is a schematic cross-sectional view of an organic light-emitting display apparatus 1 according to an embodiment.

Referring to FIG. 1, a buffer layer 11, a first insulating layer 13, and a second insulating layer 15 may be sequentially disposed in a first region 100 of a substrate 10. The buffer layer 11, the first insulating layer 13, and the second insulating layer 15 may include an unevenness portion 116 including concavities 116a and the protrusions 116b that are disposed between the concavities 116a. A third insulating layer 118, a pixel electrode 119, an organic emission layer 122, and an opposite electrode 123 may be sequentially disposed on the second insulating layer 15.

A thin film transistor (TFT), including an active layer 212, a gate electrode 214, a source electrode 220a and a drain electrode 220b, the first insulating layer 13 that is disposed between the active layer 212 and the gate electrode 214, and the second insulating layer 15 that is disposed between the gate electrode 214 and the source electrode 220a and the drain electrode 220b, may be disposed in a second region 200 that is adjacent to the first region 100 of the substrate 10 in a lateral direction of the organic light-emitting display apparatus 1, A capacitor, including a lower electrode 314, a dielectric layer 318, and an upper electrode 319, may be disposed in a third region 300 that is adjacent to the second region 200 in a lateral direction of the organic light-emitting display apparatus 1. A pad electrode 420 may be disposed in a fourth region 400 that is adjacent to the third region 300 in the lateral direction of the organic light-emitting display apparatus 1.

The substrate 10 may be formed of glass that is a transparent material of which main component is $SiO_2$. In other implementations, the substrate 10 may be a substrate formed of various other materials, such as transparent plastic.

The buffer layer 11, the first insulating layer 13, the second insulating layer 15, and the third insulating layer 118 may be sequentially disposed in the first region 100 of the substrate 10. Refractive indices of the buffer layer 11, the first insulating layer 13, the second insulating layer 15, and the third insulating layer 118 that are adjacent to one another may be different. Such a plurality of insulating layers may constitute a distributed Bragg reflector (DBR) resonant structure to improve the light coupling efficiency and color reproducibility of the organic light-emitting display apparatus 1.

The buffer layer 11, the first insulating layer 13, the second insulating layer 15, and the third insulating layer 118 may include at least one of $SiN_x$, $SiO_2$, SiON, $HfO_2$, $Si_3N_4$, $ZrO_2$, $TiO_2$, $Ta_2O_4$, $Ta_2O_5$, $Nb_2O_5$, $Al_2O_3$, BST, and PZT. The buffer layer 11 may serve as the DBR resonant structure, may prevent penetration of impurities into the substrate 10, and may planarize the surface of the substrate 10. Although the organic light-emitting display apparatus 1 according to the current embodiment may include the buffer layer 11, in other implementations, the buffer layer 11 may be omitted.

The buffer layer 11, the first insulating layer 13, and the second insulating layer 15 may have the same etching surface and include an unevenness portion 116 including the concavities 116a, which are defined by the etching surface, and the protrusions 116b, which are between the concavities 116a. In the current embodiment, the unevenness portion 116 may be formed in the buffer layer 11, the first insulating layer 13, and the second insulating layer 15. However, in other implementations, the unevenness portion 116 may be formed only in the second insulating layer 15 or only in the first insulating layer 13 and the second insulating layer 15. The height of the second insulating layer 15 may be equal to or greater than 0.5 μm, and the height h of the protrusions 116b may be equal to or greater than 0.5 μm. Portions of the buffer layer 11, the first insulating layer 13, and the second insulating layer 15 that correspond to the concavities 116a may be fully or partially etched. That is, only a portion of the second insulating layer 15 may be etched, or the second insulating layer 15 may be fully etched so that the first insulating layer 13 may be exposed, or the first insulating layer 13 may be etched along the etching surface of the second insulating layer 15 so that the concavities 116a may be extended. Also, as in the current embodiment, the buffer layer 11 and the first insulating layer 13 may be etched along the etching surface of the second insulating layer 15 so that the concavities 116a may be further extended. In this case, the height h of the protrusions 116b that are disposed between the extended concavities 116a may be equal to or greater than 1 μm.

The degree of a reduction in a color shift in the lateral direction of the organic light-emitting display apparatus 1 according to the current embodiment may vary according to the height h of the protrusions 116b that are between the concavities 116a. The height h of the protrusions 116b may be properly selected in consideration thereof. When the buffer layer 11 and the first insulating layer 13 are fully etched, the height h of the unevenness portion 116 is sufficiently large so that color shift may be further efficiently reduced. However, when the buffer layer 11 is fully etched, impurities may penetrate into the substrate 10 so a degree of etching may be controlled considering this.

A distance between the protrusions 116b may be uniform, and the protrusions 116b may have various shapes, such as a circular shape, a triangular shape, a rectangular shape, a pentagonal shape, a hexagonal shape, an octagonal shape, or the like. Although FIG. 1 illustrates four protrusions 116b, the number of protrusions 116b may vary.

In the organic light-emitting display apparatus 1 according to the current embodiment, light that is emitted from the organic emission layer 122 is incident on the buffer layer 11, the first insulating layer 13, and the second insulating layer 15 that include the unevenness portion 116, and is reflected or refracted in all directions due to the unevenness portion 116. Thus, the distribution of light that is emitted in front and lateral directions of the organic light-emitting display apparatus 1 may be made uniform so that a color shift of light that is emitted in the lateral direction of the organic light-emitting display apparatus 1 may be reduced.

The third insulating layer 118, the pixel electrode 119, the organic emission layer 122, and the opposite electrode 123 may be sequentially disposed on the second insulating layer 15 including the unevenness portion 116. The third insulating layer 118 and the pixel electrode 119 may include the same etching surface.

The pixel electrode 119 may be formed of a transparent or semi-transparent conductive material. The transparent/semi-transparent conductive material may include at least one of indium tin oxide (ITO), indium zinc oxide (IZO), zinc oxide (ZnO), indium oxide ($In_2O_3$), indium gallium oxide (IGO), and aluminum zinc oxide (AZO). The pixel electrode 119 may further include a semi-transparent metallic layer. The semi-transparent metallic layer may include at least one of silver (Ag), aluminum (Al), and an alloy thereof.

The pixel electrode 119 may further include the semi-transparent metallic layer (not shown) as well as the transparent conductive material. The semi-transparent metallic layer may include at least one of Ag, Al, and an alloy thereof and may be formed to a thickness that is equal to or less than 30 nm so as to have some permeability.

A fourth insulating layer 21 may be disposed at both edges of the pixel electrode 119 and may serve as a pixel-defining layer (PDL) that defines a pixel region.

The fourth insulating layer 21 may be an organic insulating layer. The fourth insulating layer 21 may include general polymer, such as polymethylmethacrylate (PMMA) or polystyrene (PS), a polymer derivative having a phenol group, an acryl-based polymer, an imide-based polymer, an aryl ether-based polymer, an amide-based polymer, a fluorine-based polymer, a p-xylene-based polymer, a vinyl alcohol-based polymer, or a blend thereof, as examples. The fourth insulating layer 21 may be formed as an inorganic insulating layer, similar to the buffer layer 11 and the first, second, and third insulating layers 13, 15, and 118, or may be formed by alternately forming an organic layer and an inorganic layer.

The organic emission layer 122 may be formed of a low molecular weight organic material or a polymer organic material. If the organic emission layer 122 is formed of a low molecular weight organic material, a hole transport layer (HTL), a hole injection layer (HIL), an electron transport layer (ETL), an electron injection layer (EIL), and the like may be stacked on the organic emission layer 122. Besides these layers, other layers may be stacked on the organic emission layer 122 if desired. Various organic materials, such as copper phthalocyanine (CuPc), N-di(naphthalene-1-yl)-N, N'-diphenyl-benzidine (NPB), tris-8-hydroxyquinoline aluminum ($Alq_3$), and the like may be used. If the organic emission layer 91 is formed of a polymer organic material, an HTL as well as the organic emission layer 122 may be included. The HTL may be formed of poly-(3,4)-ethylene-dihydroxy thiophene (PEDOT), polyaniline (PANI), or the like. In this case, organic materials, such as poly-phenylenevinylene (PPV)-based and polyfluorene-based polymer organic material, and the like, may be used.

The opposite electrode 123 may be a reflection electrode including a reflection material. In the current embodiment, the pixel electrode 119 is used as an anode and the opposite electrode 123 is used as a cathode. However, in other implementations, the polarities of the pixel electrode 119 and the opposite electrode 123 may be the opposite of this. The opposite electrode 123 may include at least one of Ag, Al, Mg, Li, Ca, LiF/Ca, and LiF/Al.

The opposite electrode 123 may be formed as a reflection electrode so that light emitted from the organic emission layer 122 is reflected by the opposite electrode 123, is transmitted through the pixel electrode 119 formed of a transparent/semi-transparent conductive material, and is emitted towards the substrate 10. Due to the DBR resonant structure formed by the buffer layer 11 and the first, second, and third insulating layers 13, 15, and 118, the light coupling efficiency and color reproducibility of the organic light-emitting display apparatus 1 may be improved and color shift may be reduced due to the unevenness structure formed in the buffer layer 11 and the first and second insulating layers 13 and 15, as described above.

In addition, together with the semi-transparent metallic layer included in the pixel electrode 119, the opposite electrode 123 may constitute a resonant structure, such as a DBR mirror. The semi-transparent metallic layer may serve as a semi-transparent mirror, and the opposite electrode 123 may serve as a reflection electrode so that resonance between the opposite electrode 123 and the semi-transparent metallic layer may occur. The organic light-emitting display apparatus 1 according to the current embodiment may include both the DBR resonant structure and a resonance structure as the DBR mirror so that luminous efficiency and color reproducibility of the organic light-emitting display apparatus 1 may be further improved.

The TFT, including the active layer 212, the gate electrode 214, and the source electrode 220a and the drain electrode 220b, may be disposed in the second region 200 that is adjacent to the first region 100 of the substrate 10 in the lateral direction of the organic light-emitting display apparatus 1.

The active layer 212 may be formed of a semiconductor material, such as amorphous silicon or polysilicon, and may include a channel region 212c between a source region 212a and a drain region 212b, which are doped with an ion impurity.

The gate electrode 214 may be disposed to correspond to the active layer 212 with the first insulating layer 13 in the first region 100 between the active layer 212 and the gate electrode 214. The first insulating layer 13 may serve as a gate insulating layer that insulates the gate electrode 214 of the TFT from the active layer 212.

The gate electrode 214 may include at least one metallic material selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu) and may be formed as a single layer or as a multi-layer structure.

The second insulating layer 15 in the first region 100 may extend onto the gate electrode 214, and the source electrode 220a and the drain electrode 220b of the TFT may contact the source region 212a and the drain region 212b of the active layer 212, respectively, with the second insulating layer 15 interposed therebetween. The second insulating layer 15 may serve as an interlayer insulating layer of the TFT. The source electrode 220a and the drain electrode 220b may include at least one metallic material selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu) and may be formed as a single layer or as a multi-layer structure. At least a portion of the pixel electrode 119 in the first region 100 may be disposed to directly contact the source electrode 220a or the drain electrode 220b. The source electrode 220a or drain electrode 220b may cover an edge portion of the pixel electrode 119 so that the pixel electrode 119 and the source electrode 220a or the drain electrode 220b are electrically connected to each other.

The fourth insulating layer 21 may be disposed on the second insulating layer 15 so as to cover the source electrode 220a and the drain electrode 220b.

The capacitor, including the lower electrode 314, the dielectric layer 318, and the upper electrode 319, may be disposed in the third region 300 that is adjacent to the second region 200 in the lateral direction of the organic light-emitting display apparatus 1 illustrated in FIG. 1. The dielectric layer 318 and the upper electrode 319 may include the same etching surface.

Each of the lower electrode 314 and the upper electrode 319 may be disposed on the same layer as a layer on which the gate electrode 214 and the pixel electrode 119 are disposed. The lower electrode 314 and the upper electrode 319 may include the same materials as the materials used in forming the gate electrode 214 and the pixel electrode 119. Also, the dielectric layer 318 and the third insulating layer 118 may be formed from the same layer and the dielectric layer 318 may include the same material as a material used in forming the third insulating layer 118.

The second insulating layer 15 that is disposed between the gate electrode 214 and the source electrode 220a and the drain electrode 220b of the TFT may be disposed to cover edges of the lower electrode 314. The second insulating layer 15A may prevent leakage current between the lower electrode 314 and the upper electrode 319 of the capacitor.

In the current embodiment, the second insulating layer 15 that serves as an interlayer dielectric layer in the TFT does not serve as a dielectric layer of the capacitor. Thus, the materials and thicknesses of the second insulating layer 15 and the dielectric layer 318 may be adjusted according to characteristics of the TFT and the capacitor.

The thickness of the second insulating layer 15 may be sufficiently large without considering electric capacitances of the capacitor and may be equal to greater than 0.5 μm. Because of the second insulating layer 15 may have a large thickness, a stepped part of the unevenness portion 116 formed in the first region 100 may be formed to be sufficiently large so that scattering of light emitted from the organic emission layer 122 may occur sufficiently In addition, since the dielectric layer 318 may be formed as a separate layer from the first insulating layer 13 that serves as a gate insulating layer, the dielectric layer 318 may be formed of a material having a larger dielectric constant than that of the first insulating layer 13 so that electrostatic capacitances of the capacitor may be increased. Thus, the electrostatic capacitances of the capacitor may be increased without having to increase the area of the capacitor. Thus, the area of the pixel electrode 119 may be made relatively large so that an aperture ratio of the organic light-emitting display apparatus 1 may be increased.

The fourth insulating layer 21 may be disposed on the upper electrode 319. The fourth insulating layer 21, including an organic insulating material having a small dielectric constant, may be interposed between the opposite electrode 123 and the upper electrode 319 so that parasitic capacitances that may be formed between the opposite electrode 123 and the upper electrode 319 may be reduced and signal disturbance caused by the parasitic capacitances may be prevented.

The pad electrode 420, which is a connection terminal of an external driver, may be disposed in the organic light-emitting display apparatus 1 to be exposed to the outside. The pad electrode 420 may be disposed on the same layer on which the source electrode 220a and the drain electrode 220b are disposed. The pad electrode 420 may include the same material as a material used in forming the source electrode 220a and the drain electrode 220b. The pad electrode 420 may be directly disposed on the second insulating layer 15. Other elements may not be disposed on the pad electrode 420.

FIGS. 2 through 7 are cross-sectional views sequentially illustrating a method of manufacturing the organic light-emitting display apparatus 1 illustrated in FIG. 1, according to an embodiment.

Figure 2:
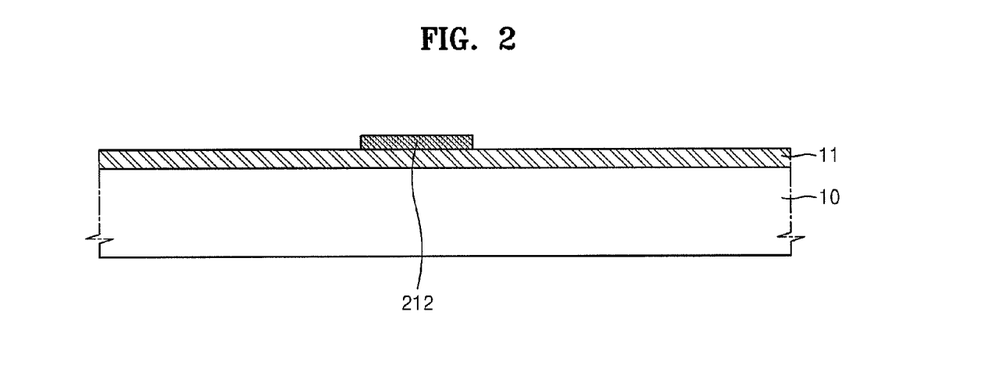
FIGS. 2 through 7 are cross-sectional views sequentially illustrating a method of manufacturing the organic light-emitting display apparatus illustrated in FIG. 1, according to an embodiment.

FIG. 2 illustrates a resultant structure of a first mask process. Referring to FIG. 2, a buffer layer 11 may be formed on the entire surface of a substrate 10, and an active layer 212 of a TFT may be formed on the buffer layer 11. Although a process of manufacturing the organic light-emitting display apparatus 1 of FIG. 1 is not shown in detail, a semiconductor layer may be formed on the entire surface of the buffer layer 11, and a photoresist (not shown) may be applied to the semiconductor layer. The semiconductor layer may be patterned using a photolithography process using a first mask (not shown), thereby forming the active layer 212.

The semiconductor layer may be formed of amorphous silicon or polysilicon. The semiconductor layer may be deposited on the buffer layer 11 by using various deposition methods, such as plasma-enhanced chemical vapor deposition (PECVD), atmospheric pressure CVD (APCVD), low pressure CVD (LPCVD), or the like.

The first mask process using the photolithography process may be performed by exposing the first mask (not shown) by using an exposure device (not shown) and then by performing a series of processes, such as developing, etching, and stripping or ashing, or the like. Hereinafter, in subsequent mask processes, descriptions already described above will not be repeated.

Figure 3:
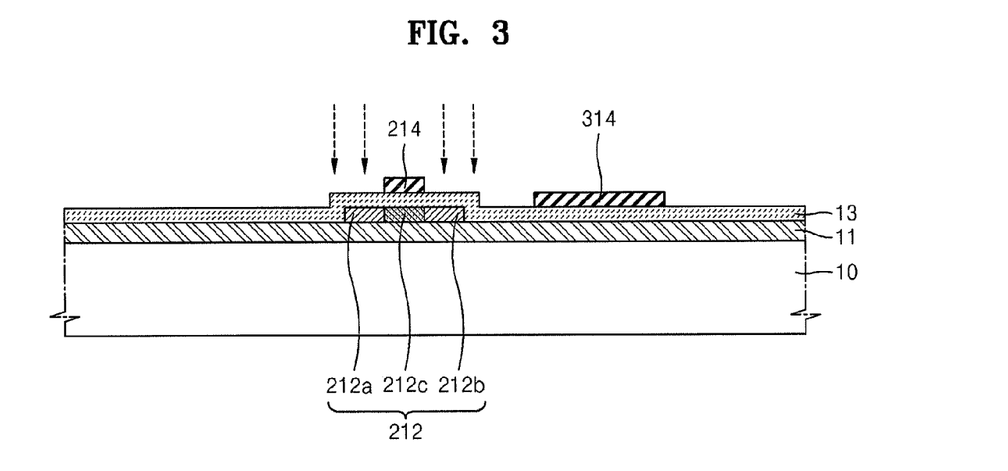

FIG. 3 illustrates a resultant structure of a second mask process. Referring to FIG. 3, a first insulating layer 13 may be formed on the entire surface of the resultant structure of the first mask process, and a gate electrode 214 of the TFT and a lower electrode 314 of a capacitor may be formed on the first insulating layer 13. The first insulating layer 13 may be disposed between the active layer 212 and the gate electrode 214 of the TFT and may serve as a gate insulating layer. The first insulating layer 13 may be disposed under the lower electrode 314 of the capacitor. Accordingly, the first insulating layer does not vary the characteristics of the capacitor. Thus, the material and thickness of the first insulating layer 13 may be selected considering only the characteristics of the TFT. The first insulating layer 13 may be formed using a material having a different refractive index from that of the buffer layer 11.

The active layer 212 may be doped with an ion impurity by using the gate electrode 214 that is formed on the first insulating layer 13 as a self-aligned mask, thereby forming a source region 212a and a drain region 212b that are doped with an ion impurity and a channel region 212c that is not doped with an ion impurity.

The gate electrode 214 and the lower electrode 314 of the capacitor may be formed by stacking a first conductive layer that is formed of at least one metallic material selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu) on the first insulating layer 13 and by patterning the first conductive layer by using a second mask.

Figure 4:
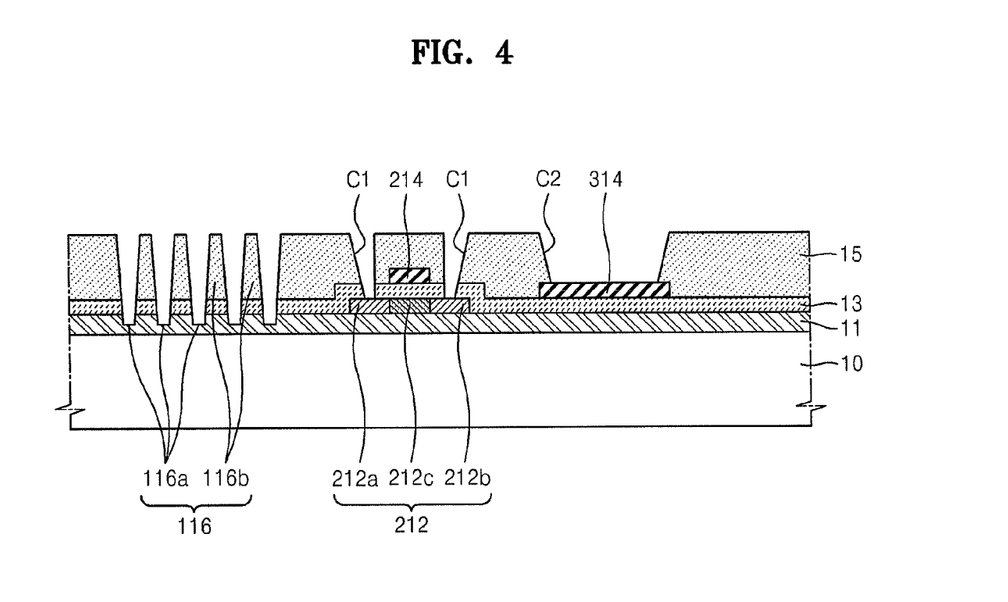

FIG. 4 illustrates a resultant structure of a third mask process. Referring to FIG. 4, a second insulating layer 15 may be formed on the resultant structure of the second mask process of FIG. 3 and may be patterned using a third mask (not shown). An unevenness portion 116 may be formed in a region corresponding to an emission region in which the organic emission layer 122 of FIG. 1 is disposed. The unevenness portion may include concavities 116a and protrusions 116b between the plurality of concavities 116a, a first opening C1 through which the source region 212a and the drain region 212b of the active layer 212 of the TFT are exposed, and a second opening C2 through which the lower electrode 314 of the capacitor is exposed, may be.

The second insulating layer 15 may serve as an interlayer insulating layer of the TFT and may be formed to cover edges of the lower electrode 314 of the capacitor. Thus, the material and thickness of the second insulating layer 15 may be freely selected considering only the characteristics of the TFT. The height of the second insulating layer 15 may be equal to or greater than 0.5 µm. The second insulating layer 15 may be formed using a material having a different refractive index from that of the first insulating layer 13.

Refractive indices of the buffer layer 11, the first insulating layer 13, and the second insulating layer 15 that are adjacent to one another may be different so that a distributed Bragg reflector (DBR) resonant structure may be formed.

When the unevenness portion 116 is formed, the buffer layer 11, the first insulating layer 13, and the second insulating layer 15 may be simultaneously patterned and thus may have the same etching surfaces. The height of the protrusions 116b of the unevenness portion 116 may be equal to or greater than 0.5 µm. The height of the protrusions 116b may be adjusted according to the amount of exposure of the third mask process or an etching rate. The height of the second insulating layer 15 that serves as an interlayer insulating layer may be equal to or greater than 0.5 µm, and the unevenness portion 116 may be formed by etching the buffer layer 11 and the first insulating layer 13. Thus, the unevenness portion 116 that has a sufficient height may be formed so that a color shift that occurs in a lateral direction of the organic light-emitting display apparatus 1 due to the DBR resonant structure may be efficiently reduced. The height of the protrusions 116b may be equal to or greater than 1 µm.

Figure 5:
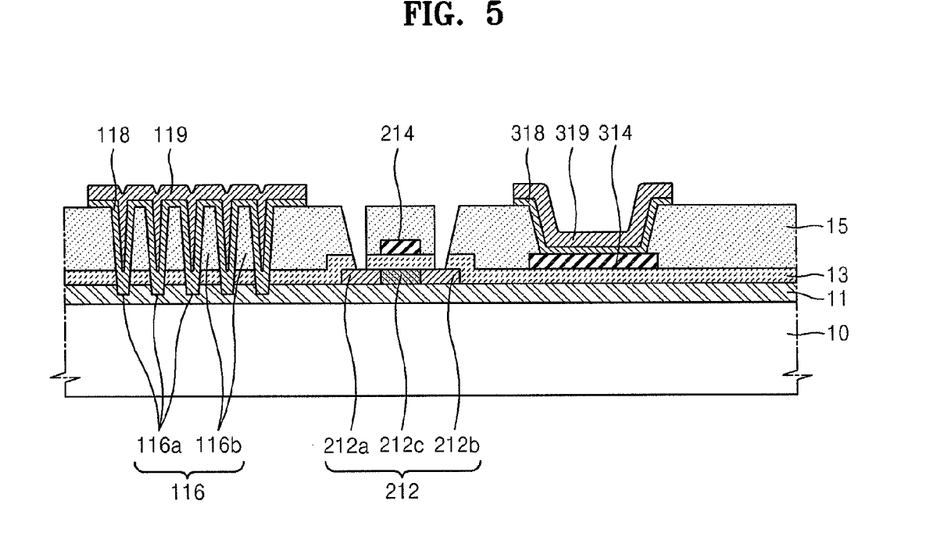

FIG. 5 illustrates a resultant structure of a fourth mask process. Referring to FIG. 5, a third insulating layer 118, a dielectric layer 318, a pixel electrode 119, and an upper electrode 319 may be formed on the resultant structure of the third mask process. The third insulating layer 118 and the dielectric layer 318 and the pixel electrode 119 and the upper electrode 319 may be formed from the same material layers.

The third insulating layer 118 and the dielectric layer 318 may be formed by patterning an organic insulating layer that is formed of a material selected from $SiN_x$, $SiO_2$, SiON, $HfO_2$, $Si_3N_4$, $ZrO_2$, $TiO_2$, $Ta_2O_4$, $Ta_2O_5$, $Nb_2O_5$, $Al_2O_3$, BST, and PZT. The pixel electrode 119 and the upper electrode 319 may be formed by patterning a second conductive layer that is formed of a transparent conductive material selected from indium tin oxide (ITO), indium zinc oxide (IZO), zinc oxide (ZnO), indium oxide ($In_2O_3$), indium gallium oxide (IGO), and aluminum zinc oxide (AZO).

The third insulating layer 118 and the dielectric layer 318 and the pixel electrode 119 and the upper electrode 319 may be patterned using the same mask process and thus may have the same etching surface. However, materials that are used in forming the third insulating layer 118 and the dielectric layer 318 and materials that are used in forming the pixel electrode 119 and the upper electrode 319 may be different. Accordingly, an etching process may be performed twice.

The dielectric layer 318 may be disposed between the lower electrode 314 and the upper electrode 319 of the capacitor and is not disposed on the TFT. Accordingly, the material and thickness of the dielectric layer 318 may be selected based on only the characteristics of the capacitor without having to consider the characteristics of the TFT.

Figure 6:
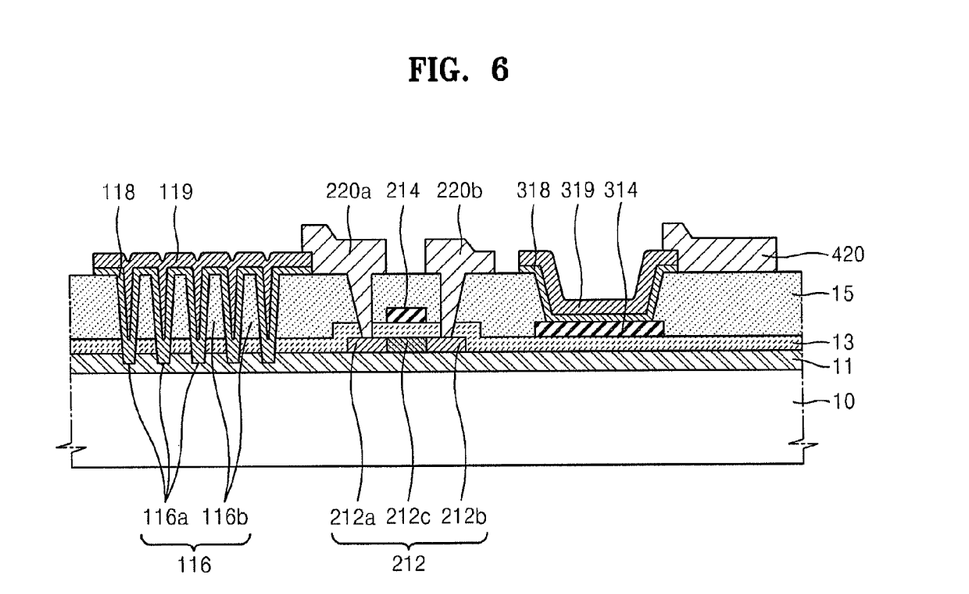

FIG. 6 illustrates a resultant structure of a fifth mask process. Referring to FIG. 6, a source electrode 220a and a drain electrode 220b of the TFT and a pad electrode 420 may be formed on the resultant structure of the fourth mask process of FIG. 5.

The source electrode 220a and the drain electrode 220b may be formed by patterning a third conductive layer and may be connected to the source region 212a and the drain region 212b of the active layer 212, respectively, via the first opening C1. Also, the source electrode 220a or the drain electrode 220b, that is, in the current embodiment, the source electrode 220a, may be formed to cover a portion of edges of the pixel electrode 119 and may be electrically connected to the pixel electrode 119.

The pad electrode 420 may be formed to cover a portion of edges of the upper electrode 319 of the capacitor.

Figure 7:
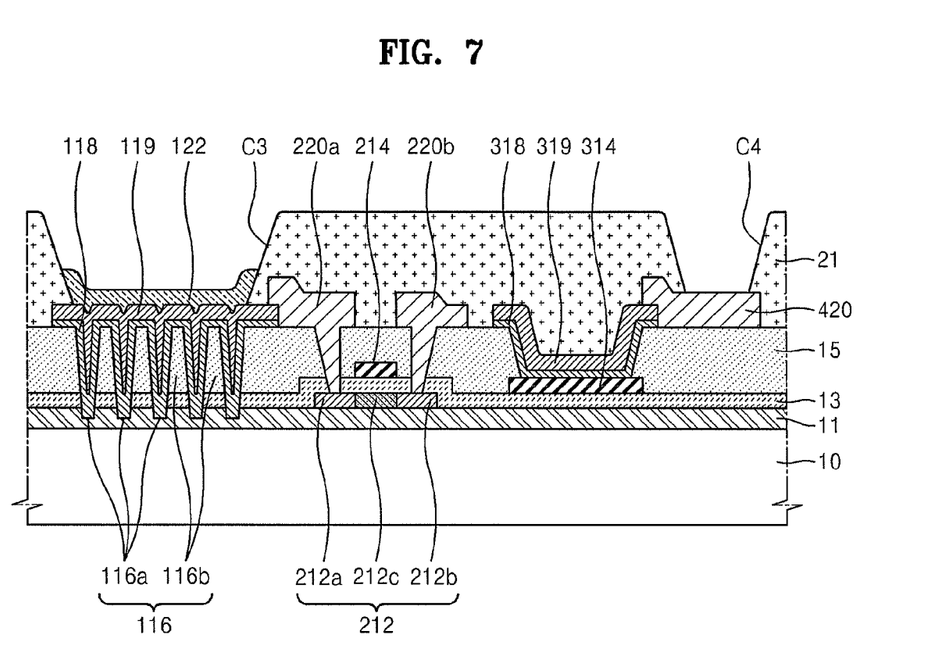

FIG. 7 illustrates a resultant structure of a sixth mask process. Referring to FIG.

7, a fourth insulating layer 21 may be formed on the resultant structure of the fifth mask process. A third opening C3 through which the pixel electrode 119 is exposed and a fourth opening C4 through which the pad electrode 420 is exposed may be formed in the fourth insulating layer 21 by performing the sixth mask process.

The third opening C3 through which the pixel electrode 119 is exposed may define the emission region and also may widen a distance between the pixel electrode 119 and the opposite electrode 123 of FIG. 1 so that a phenomenon that an electric field becomes concentrated on the edges of the pixel electrode 119 may be prevented, in order to prevent shorts between the pixel electrode 119 and the opposite electrode 123.

The organic emission layer (122 of FIG. 1) and the opposite electrode (123 of FIG. 1) may be formed on the third opening C3 of the resultant structure of the sixth mask process to complete the manufacture of the organic light-emitting display apparatus 1 of FIG. 1.

Figure 8:
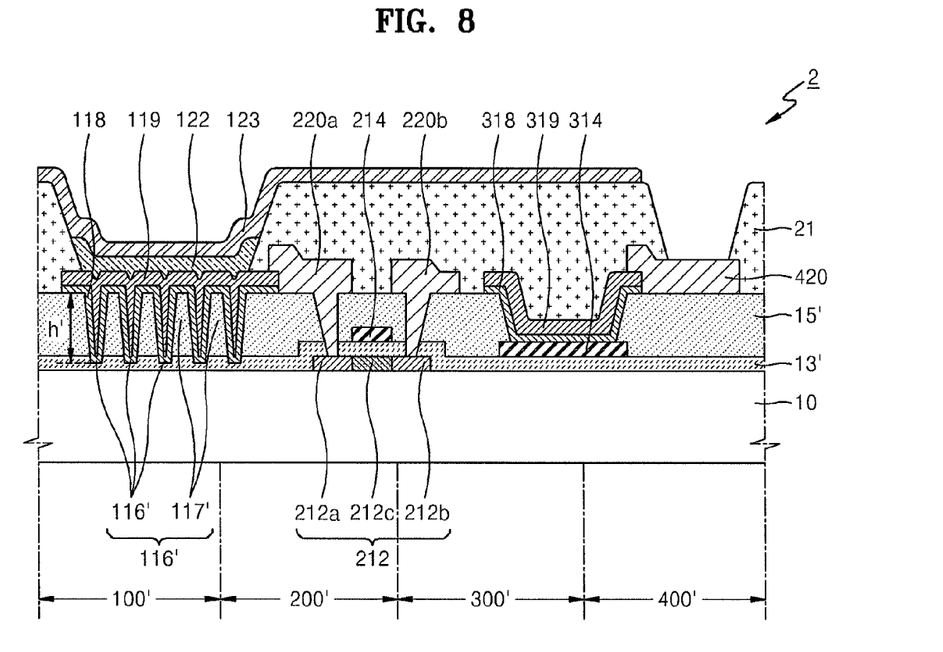
FIG. 8 is a schematic cross-sectional view of an organic light-emitting display apparatus according to another embodiment.

FIG. 8 is a schematic cross-sectional view of an organic light-emitting display apparatus 2 according to another embodiment.

The organic light-emitting display apparatus 2 according to the current embodiment has substantially the same structure as that of the organic light-emitting display apparatus 1 of FIG. 1. A difference between the embodiment of FIG. 1 and the embodiment of FIG. 8 is that the buffer layer 11 of FIG. 1 is not present in the embodiment of FIG. 8, and only a portion of a first insulating layer 13' is etched in the forming of an unevenness portion 116'.

As described above, the degree of etching of the first insulating layer 13' and a second insulating layer 15' may be adjusted to adjust a height h' of protrusions 116b' that are disposed between concavities 116a' of the unevenness portion 116'. Only a portion of the second insulating layer 15' may be etched, or the second insulating layer 15' may be fully etched to expose the first insulating layer 13', or as in the current embodiment, the first insulating layer 13' may be etched along the etching surface of the second insulating layer 15', so that the concavities 116a' may be extended.

FIGS. 9A through 9D illustrate the effect of improvement in the color shift of the organic light-emitting display apparatuses 1 and 2 illustrated in FIGS. 1 and 8.

Figure 9A:
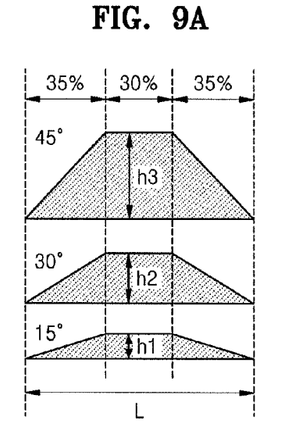
FIGS. 9A through 9D illustrate the effect of improvement in color shift of the organic light-emitting display apparatuses illustrates in FIGS. 1 and 8.

FIG. 9A schematically illustrates shapes of the unevenness portions. A width L of a bottom surface of each of the unevenness portions is 10 µm. The unevenness portions have a shape in which the height of the unevenness portions is tapered towards both sides of a center portion that has the largest height from the bottom surface of the unevenness portions.

When unevenness portions have the same width L of the bottom surface, their heights may vary according to gradients of tapered regions, and the height of the unevenness portions at angles of 15°, 30°, and 45° may be about 0.9 µm(h1), about 2.0 µm(h2), and 3.5 µm(h3), respectively.

Figure 9B:
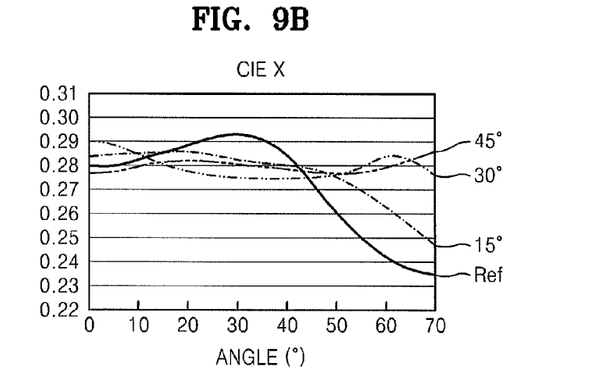
Figure 9C:
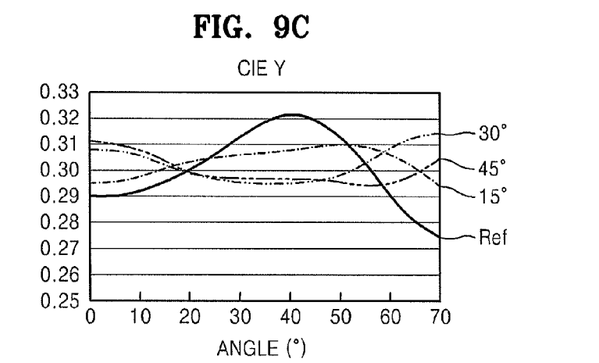

FIGS. 9B and 9C are graphs showing color coordinates values according to the angles (°) at which an organic light-emitting display apparatus is inclined towards a lateral direction from a front direction of the organic light-emitting display apparatus. Color coordinate values according to gradients of the tapered regions when heights of the unevenness portions are different are shown in the graphs of FIGS. 9B and 9C.

In this case, the X-axes of FIGS. 9B and 9C represent angles (°) at which the organic light-emitting display apparatus is inclined towards the lateral direction from the front direction of the organic light-emitting display apparatus in the X-axis direction or the Y-axis direction, and the Y-axes of FIGS. 9B and 9C represent color coordinate values.

As the heights of the unevenness portions increase, as shown in the graphs of FIGS. 9B and 9C, a variation in the color coordinate values according to angles at which the organic light-emitting display apparatus is inclined towards the lateral direction from the front direction of the organic light-emitting display apparatus in the X-axis direction or the Y-axis direction, i.e., color shift may be remarkably reduced.

Figure 9D:
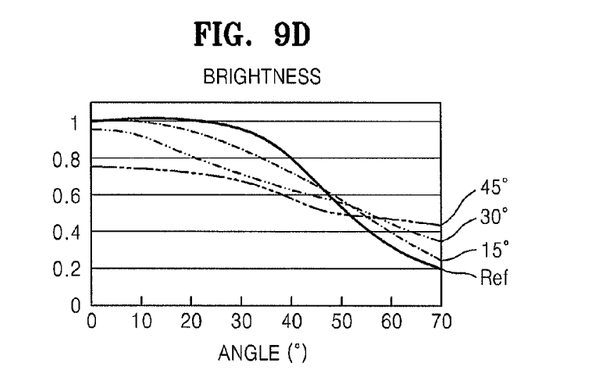

FIG. 9D is a graph showing the brightness of the organic light-emitting display apparatus according to angles (°) at which the organic light-emitting display apparatus is inclined towards the lateral direction from the front direction of the organic light-emitting display apparatus in the X-axis direction or the Y-axis direction. As the heights of the unevenness portions increase, as shown in the graph of FIG. 9D, a variation in brightness according to angles at which the organic light-emitting display apparatus is inclined towards the lateral direction from the front direction of the organic light-emitting display apparatus may be reduced.

By way of summation and review, an organic light-emitting display apparatus may have wide emission wavelengths. In a typical organic light-emitting display apparatus, the luminous efficiency of the organic light-emitting display apparatus may be lowered and the color purity thereof may also be lowered. In addition, since light that is emitted from an organic emission layer has no particular directivity, most photons that are emitted in an arbitrary direction may not reach an actual observer due to internal total reflection of a typical organic light-emitting device. Accordingly, a light coupling efficiency of the organic light-emitting device may be lowered. In order to improve the light coupling efficiency of the organic light-emitting device, a distributed Bragg reflector (DBR) mirror or a resonant structure in which the thickness of the organic emission layer is controlled may be used in the organic light-emitting display apparatus. Such a resonant structure may cause an improvement in the light coupling efficiency of the organic light-emitting device. However, a color shift may still occur due to a viewing angle.

The present embodiments advance the art by providing an organic light-emitting display apparatus and a method of manufacturing the same, wherein a resonant structure including an unevenness portion may be used so that a color shift caused by a viewing angle may be reduced.

In addition, a DBR resonant structure may be constituted by providing a plurality of layers having different refractive indices so that light coupling efficiency and color reproducibility of the organic light-emitting display apparatus may be improved.

In addition, an unevenness portion that has a large stepped part may be formed by using a 6-mask process.

In addition, a dielectric layer of a capacitor and a gate insulating layer of a TFT may be formed as separate insulating layers so that the insulating layers may be designed to be suitable for characteristics of each of the capacitor and the TFT.

As described above, in an organic light-emitting display apparatus and a method of manufacturing the same, according to one or more embodiments, image quality characteristics of the organic light-emitting display apparatus may be easily improved.

While the embodiments have been particularly shown and described with reference to exemplary embodiments thereof, it will be understood by those of ordinary skill in the art that various changes in form and details may be made therein without departing from the spirit and scope as defined by the following claims.

What is claimed is:

1. An organic light-emitting display apparatus comprising:
an organic light-emitting device including a first insulating layer disposed on a substrate, a second insulating layer disposed on the first insulating layer and including an unevenness portion, a third insulating layer disposed on the second insulating layer, a pixel electrode disposed on the third insulating layer, an opposite electrode disposed to face the pixel electrode, and an organic emission layer disposed between the pixel electrode and the opposite electrode;
a thin film transistor (TFT) including an active layer disposed on the substrate, a gate electrode disposed to be insulated from the active layer, and a source electrode and a drain electrode that are connected to the active layer, wherein the first insulating layer is disposed between the active layer and the gate electrode and the second insulating layer is disposed between the gate electrode and the source electrode and the drain electrode; and
a capacitor including a lower electrode directly disposed on a same layer as the gate electrode, an upper electrode directly disposed on a same layer as the pixel electrode, and a dielectric layer formed from a same material as the third insulating layer and disposed between the lower electrode and the upper electrode.

2. The organic light-emitting display apparatus as claimed in claim 1, wherein:
the first insulating layer, the second insulating layer, and the third insulating layer are sequentially disposed between the substrate and the pixel electrode, and
at least two of the first through third insulating layers have different refractive indices.

3. The organic light-emitting display apparatus as claimed in claim 1, wherein:

the unevenness portion includes a plurality of concavities and a plurality of protrusions between the concavities, and the second insulating layer is fully etched in a region corresponding to the plurality of concavities.

4. The organic light-emitting display apparatus as claimed in claim 3, wherein the first insulating layer is etched along an etching surface of the second insulating layer in the region corresponding to the concavities, such that the concavities are extended.

5. The organic light-emitting display apparatus as claimed in claim 3, further including a buffer layer disposed between the substrate and the first insulating layer.

6. The organic light-emitting display apparatus as claimed in claim 5, wherein a refractive index of the buffer layer is different from a refractive index of the first insulating layer.

7. The organic light-emitting display apparatus as claimed in claim 5, wherein the first insulating layer and the buffer layer are etched along an etching surface of the second insulating layer in the region corresponding to the concavities, so as to form extended concavities.

8. The organic light-emitting display apparatus as claimed in claim 7, wherein a height of protrusions that are disposed between the extended concavities is equal to or greater than 0.5 μm.

9. The organic light-emitting display apparatus as claimed in claim 1, wherein a thickness of the third insulating layer is less than a thickness of the second insulating layer.

10. The organic light-emitting display apparatus as claimed in claim 1, wherein a dielectric constant of the third insulating layer is larger than a dielectric constant of the first insulating layer.

11. The organic light-emitting display apparatus as claimed in claim 1, wherein the pixel electrode includes at least one transparent conductive material selected from indium tin oxide (ITO), indium zinc oxide (IZO), zinc oxide (ZnO), indium oxide ($In_2O_3$), indium gallium oxide (IGO), and aluminum zinc oxide (AZO).

12. The organic light-emitting display apparatus as claimed in claim 11, wherein the pixel electrode further includes a semi-transparent metallic layer.

13. The organic light-emitting display apparatus as claimed in claim 1, wherein the pixel electrode and the third insulating layer have a same etching surface.

14. The organic light-emitting display apparatus as claimed in claim 1, wherein the upper electrode and the dielectric layer have a same etching surface.

15. A method of manufacturing an organic light-emitting display apparatus, the method comprising:

performing a first mask process of forming a semiconductor layer on a substrate and patterning the semiconductor layer to form an active layer of a thin film transistor (TFT);

performing a second mask process of forming a first insulating layer, stacking a first conductive layer on the first insulating layer and patterning the first conductive layer to form a gate electrode of the thin film transistor (TFT) and a lower electrode of a capacitor;

performing a third mask process of forming a second insulating layer and patterning the second insulating layer to form an unevenness portion, a first opening through which the active layer is exposed, and a second opening through which the lower electrode is exposed;

performing a fourth mask process of sequentially forming an insulating layer and a second conductive layer and simultaneously patterning the insulating layer and the second conductive layer to form a third insulating layer and a pixel electrode that are disposed on the second insulating layer and a dielectric layer and an upper electrode that are disposed on the lower electrode;

performing a fifth mask process of forming a third conductive layer and patterning the third conductive layer to form a source electrode and a drain electrode;

performing a sixth mask process of forming a fourth insulating layer and forming a third opening through which the pixel electrode is exposed; and forming an organic emission layer and an opposite electrode on the third opening.

16. The method as claimed in claim 15, wherein at least two of the first insulating layer, the second insulating layer, and the third insulating layer are formed of materials having different refractive indices.

17. The method as claimed in claim 15, wherein:

the unevenness portion includes a plurality of concavities and a plurality of protrusions between the plurality of concavities, and the second insulating layer in a region corresponding to the plurality of concavities is fully etched.

18. The method as claimed in claim 17, wherein the first insulating layer is etched along an etching surface of the second insulating layer in the region corresponding to the concavities, such that the concavities are extended.

19. The method as claimed in claim 17, further comprising forming a buffer layer on the substrate before the performing of the first mask process.

20. The method as claimed in claim 19, wherein a refractive index of the buffer layer is different from a refractive index of the first insulating layer.

21. The method as claimed in claim 19, wherein the first insulating layer and the buffer layer are etched along an etching surface of the second insulating layer in the region corresponding to the concavities, so as to form extended concavities.

22. The method as claimed in claim 21, wherein a height of protrusions that are disposed between the extended concavities is equal to or greater than 0.5μm.

* * * * *